United States Patent
Sandhu et al.

[11] Patent Number: 6,137,180
[45] Date of Patent: Oct. 24, 2000

[54] LOW COST DRAM METALLIZATION

[75] Inventors: Gurtej S. Sandhu; Sujit Sharan, both of Boise, Id.

[73] Assignee: Micron Technology, Inc., Boise, Id.

[21] Appl. No.: 09/038,211

[22] Filed: Mar. 11, 1998

Related U.S. Application Data

[62] Division of application No. 08/580,361, Dec. 28, 1995, Pat. No. 5,846,881.

[51] Int. Cl.$^7$ .............................. H01L 23/48; H01L 23/52; H01L 29/40
[52] U.S. Cl. ........................... 257/769; 257/768; 257/751
[58] Field of Search ...................................... 257/763, 751, 257/768, 769, 770

[56] References Cited

U.S. PATENT DOCUMENTS

| | | |
|---|---|---|
| 5,030,587 | 7/1991 | Wald et al. . |
| 5,147,819 | 9/1992 | Yu et al. . |
| 5,166,093 | 11/1992 | Grief . |
| 5,231,056 | 7/1993 | Sandhu . |
| 5,240,739 | 8/1993 | Doan et al. . |
| 5,278,100 | 1/1994 | Doan et al. . |
| 5,344,792 | 9/1994 | Sandhu et al. . |
| 5,376,405 | 12/1994 | Doan et al. . |
| 5,387,550 | 2/1995 | Cheffings et al. . |
| 5,420,074 | 5/1995 | Ashima . |
| 5,462,767 | 10/1995 | Yamazaki et al. . |
| 5,550,409 | 8/1996 | Yamaguchi et al. . |
| 5,565,708 | 10/1996 | Ohsaki et al. . |
| 5,834,846 | 11/1998 | Shinriki et al. . |
| 5,912,508 | 1/1999 | Iacoponi . |

FOREIGN PATENT DOCUMENTS

| | | |
|---|---|---|
| 61-183199 | 9/1986 | Japan . |
| 2-284424 | 11/1990 | Japan . |

OTHER PUBLICATIONS

S. Wolf et al., "Silicon Processing for the VLSI Era, vol. 1", Lattice Press (Calif.) (1986), p. 558.

C.W. Kaanta et al. "Dual Damascene: AULSI Wiring Technology", 1991 Proc. 8$^{th}$ International IEEE VLSI Multilevel Interconnect Conf. (Jun. 11–12, 1991), Santa Clara, Calif. pp. 144–152.

*Primary Examiner*—Sheila V. Clark
*Attorney, Agent, or Firm*—Knobbe, Martens, Olson & Bear, LLP

[57] ABSTRACT

Disclosed is a low cost contact and interconnect layer and method for fabricating the same. A contact via is opened within an insulating layer, exposing a circuit node (e.g., transistor active area within a semiconductor substrate). The via is filled with a chemical vapor deposited (CVD) titanium silicide layer, forming electrical contact with the circuit node. The silicide layer may simultaneously form the interconnect layer for one embodiment. In other embodiments, the interconnect layer may comprise a metal strap over the titanium silicide layer, or a metal layer over an etched-back titanium silicide plug in the contact via. For any of these embodiments, the contact via may be opened after the formation of interconnect trenches, the via extending from the bottom of a trench to the circuit node. CVD provides good step coverage of the via within the trench, despite the higher aspect ratio. The interconnect layer is deposited and etched back, such that the interconnect lines are defined by the trenches.

7 Claims, 3 Drawing Sheets

LOW COST DRAM METALLIZATION

This application is a divisional application of U.S. patent application Ser. No. 08/580,361, filed Dec. 28, 1995 now U.S. Pat. No. 5,846,881.

FIELD OF THE INVENTION

The present invention relates to metallization process levels in integrated circuit fabrication, and more particularly to contact and interconnect metallization to densely packed dynamic random access memory chips (DRAMs) having high aspect ratio vias.

BACKGROUND OF THE INVENTION

In processing integrated circuits, electrical contact must be made among circuit nodes, such as isolated device active regions formed within a single-crystal silicon substrate. These circuit nodes are connected by highly conductive interconnect paths or lines, fabricated above a dielectric or insulating layer which covers the substrate surface. Conductive lines and interconnects ideally have low overall resistance, which resistance depends upon both sheet resistivity and contact resistivity. Traditionally, interconnect lines designed to carry high current electrical signals have been fabricated from metals which provide extremely low sheet resistivity, such as aluminum ($\approx 2.6$ $\mu\Omega$-cm), and so the process steps in fabricating the lines are referred to as metallization steps. Alternative materials are often acceptable, however, for local interconnect of nearby circuit elements, for interlayer connection, or for lines carrying low currents.

Interlayer electrical connection must be provided through the insulating layers which separate metallization levels from underlying circuit elements (e.g., active areas, transistor gates), or one metallization level from another. Openings, typically referred to as contact openings or simply "contacts," are etched through the insulating layers and lined or filled with conductive material to provide this interlayer connection. Most efficiently, contacts should be filled simultaneously with the deposition of material forming a conductive interconnect line, thus allowing creation of an interconnect level and the interlevel contact in a single process step.

Unfortunately, such efficient fabrication has become more difficult to achieve as integrated circuits have become more densely packed. Where the insulating layer covering the substrate is thick and planarized, as opposed to thin and conformal over the substrate and gate material, the contact is often referred to as a contact via. The insulating layers must be grown or deposited to a minimum thickness. Too thin an insulating layer results in an intolerably high interlevel capacitances which ties up otherwise available conduction carriers. Thus, as circuit dimensions continue to be scaled down to the submicron level, the contact diameter shrinks in size but the depth of the via, determined by the thickness of the insulating layer, must remain the same. In other words, the aspect ratio of contact vias increases as circuitry becomes more densely packed.

While aluminum and other low-resistance metals (e.g. copper, gold) may have very low sheet resistance, they can be problematic due to contamination of the substrate, which causes parasitic leakage currents or device failure. Diffusion barriers must therefore be formed prior to depositing a metal via fill.

Additionally, metals tend to form poor contact in high aspect ratio vias. Physical deposition of metals, such as by sputtering or evaporation, produces poor step coverage into narrow, deep vias. During a metal sputter deposition, for example, metal builds quickly on the lip of the via, bulging into the via mouth. This results in a shadow effect, sheltering the lower corner of the via from further deposition and leaving only thin metal coverage of the via bottom surface. This thin layer is subject, during circuit operation, to high resistance and electromigration. Electromigration describes the motion of metal ions in response to high density current flow, which may even further thin the metal at the via bottom by piling up the metal in some regions while forming voids elsewhere.

One method of improving step coverage involves a process of sloping the sidewall of the via, thus opening the via in a tapered or cone shape. The minimum diameter of the via bottom, however, is still limited by photolithographic resolution. Sloping the via sidewall thus increases the total area occupied by the via and reduces the allowable packing density. Such decreases in packing density are unacceptable in the face of commercial requirements for the miniaturization of integrated circuits and especially DRAMs.

Chemical vapor deposition (CVD), on the other hand, may yield adequate step coverage, even for the high aspect ratio, vertical vias of current and future DRAMs. CVD polycrystalline silicon (polysilicon or poly), for example, is well known to produce conformal layers in contact vias, or polysilicon plugs which completely fill the via. One drawback to polysilicon plugs is a relatively high sheet resistivity. Additionally, polysilicon can form rectifying contacts with the active areas in these prior art interconnects. The polysilicon layer must therefore be doped to match the dopant type of the contacted active region, in order to ensure ohmic (low resistance) contact. This doping step requires at least one additional mask step, possibly two additional masks where contacted active areas include both n-doped and p-doped regions.

In place of polysilicon plugs, CVD deposition of tungsten (W) has recently seen widespread use in integrated circuit fabrication. FIG. 1 illustrates a typical configuration for a tungsten plug 10 through a contact via 12 which has been etched through an insulating layer 14. The illustrated plug 10 is meant to form contact between an active area 16 and a metal interconnect 18.

Although CVD of tungsten has been developed with good step coverage into vias, multiple processing steps are required for its integration. For example, after the via 12 has been formed, a layer of titanium (Ti) 19 is often laid first. This layer is sintered in a high temperature step at some point in the fabrication process to form a layer of titanium silicide 20 (predominantly $TiSi_2$) at the Ti/Si interface over the active area 16. The silicide serves to provide good ohmic contact between the plug and the silicon active area 16.

An adhesion layer is also required for efficient deposition into the via 12, due to poor adhesion of CVD tungsten to insulating materials in which the via 12 is formed. A titanium nitride film 22 (TiN) serves this purpose for the illustrated prior art tungsten plug. On the other hand, poor adhesion may remain in other areas, such as the wafer backside, so that an unwanted tungsten film may still delaminate and contaminate the chamber, even with the adhesion layer in the via 12 and over the insulating layer 14.

Furthermore, tungsten demonstrates higher sheet resistivity than aluminum or other conventional metal interconnects, though it is more conductive than polysilicon. Thus, the tungsten plug 10 must be used in conjunction with a lower resistance metal line, such as an aluminum interconnect 18 as illustrated in FIG. 1. Separate chambers are required for the metal interconnect deposition, and for the tungsten plug CVD after via formation. The aluminum should ideally be deposited over a planar surface prior to patterning for interconnect, and aluminum layers over tungsten tend to peel off due to high stress. Thus, the tungsten should remain only in the via, rather than over the entire wafer. If the CVD tungsten is blanket-deposited, a planarizing etchback of the tungsten is necessary to remove the excess tungsten over the insulating layer prior to aluminum deposition, for example. The etchback is difficult because it requires both a sacrificial layer and an etch process with a 1:1 etch rate ratio for the sacrificial layer and the tungsten. Seeding and selective deposit also requires an etchback step if vias of different depths are to be filled simultaneously. Even after the etchback, a second titanium layer 24 is often employed to provide both good electrical contact and good adhesion between the tungsten plug 10 and the aluminum interconnect 18.

These requirements make tungsten plugs expensive and difficult to reliably construct. Additional problems with the formation of tungsten plugs are discussed in "Silicon Processing For the VLSI Era; Vol. 2—Process Integration," by S. Wolf, published 1990 by Lattice Press, Sunset Beach, Calif., at pp. 245–52, which discussion is hereby incorporated by reference.

A need thus exists for a lower cost method of forming conductive plugs in contact vias. Ideally, the method should be capable of forming an interconnect simultaneously with the interlevel contact within the via.

SUMMARY OF THE INVENTION

According to one aspect of the invention, a method is provided for forming an interconnect layer and contact between the interconnect and an underlying circuit node. The contact is formed by first opening a contact via through an insulating layer to expose the underlying circuit node. A titanium silicide layer is then deposited over the insulating layer by chemical vapor deposition, to a thickness at least about half the via diameter. Such a deposition at least substantially fills the contact via with titanium silicide.

According to another aspect of the invention, a dynamic random access memory (DRAM) circuit is provided. An insulating layer overlies a number of circuit nodes, providing electrical isolation. Titanium silicide contact plugs extend through the insulating layer to form electrical contact with the circuit nodes. At the upper end of the silicide plugs, a conductive interconnect layer overlies the insulating layer and forms electrical contact with the plugs.

The interconnect is to be formed over the insulating layer, in electrical contact with the titanium silicide within the contact via. For a first preferred embodiment, a titanium silicide layer, formed simultaneously with the silicide plug, overlies the insulating layer and forms the interconnect layer. In another disclosed embodiment, a metal strap over the silicide layer may supplement the conductivity of the interconnect. In yet another embodiment, the titanium silicide layer may be etched back to leave silicide only in the via, as a silicide plug. A metal layer is then deposited over and in electrical contact with the silicide plug, forming the interconnect layer.

According to a further aspect of the present invention, the interconnect may be patterned into lines by depositing the interconnect material into prefabricated trenches within the insulating layer. The vias are opened from the bottom of the trenches, extending down to expose circuit nodes, such as active areas within a semiconductor substrate. In filling the vias with titanium silicide, the trenches may simultaneously be filled with titanium silicide and removed from the top surface of the insulating layer (outside of the trenches) to define the interconnect lines within the trenches. Alternatively, metal straps or completely metal interconnects may also be formed within the trenches after filling the vias with titanium silicide in accordance with the present invention and etching back the titanium silicide to leave it only within the vias.

DETAILED DESCRIPTION OF THE PREFERRED EMBODIMENT

Although the present invention is described in the context of fabricating dynamic random access memory devices (DRAMs), those skilled in the arts of conductive plug fabrication and interconnect fabrication will find application for the present invention in many other contexts, especially where tungsten plugs have been used in the past. Furthermore, although the various embodiments include various layer thicknesses in accord with the best mode of practice known to the inventors, the present invention is not conceived as limited to the particular thicknesses described herein.

As mentioned in the "Background" section above, contemporary DRAM fabrication must contend with high packing density requirements and consequent high aspect ratio vias. Electrical connection is to be formed through these vias between circuit nodes (e.g., transistor active areas within a silicon substrate) and a conductive interconnect layer. Formation of the contact vias, interconnect layer, and patterned interconnect lines may collectively be referred to as a metallization level.

Figure 2:
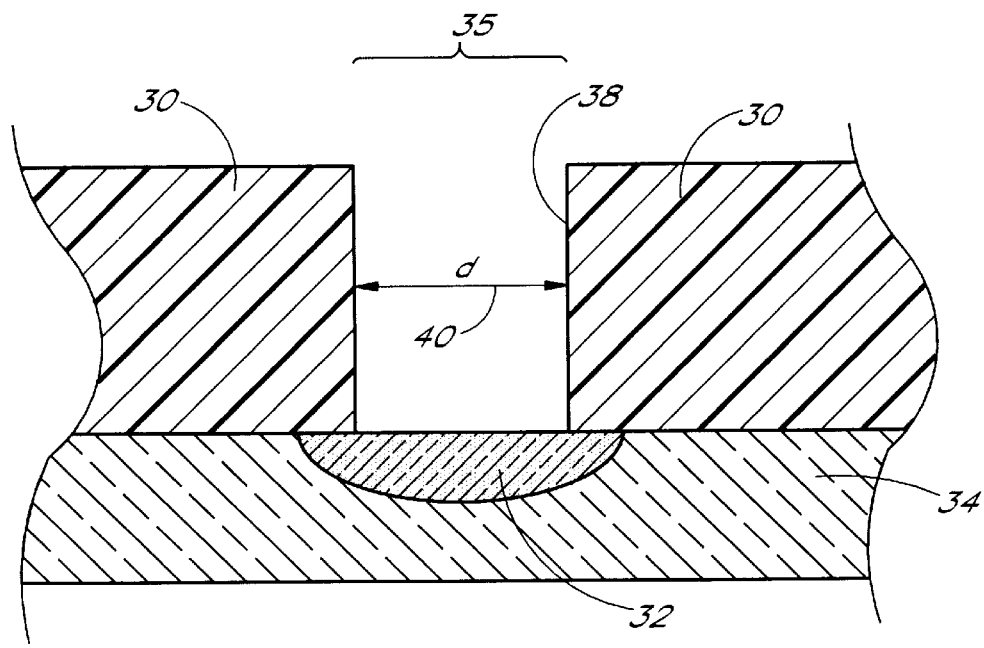
FIGS. 2–3 illustrate generally the method steps for providing a silicide plug in a contact via, in accordance with a first preferred embodiment of the present invention.

FIG. 2 illustrates a starting point for the preferred embodiments of the present invention, showing a partial section of a DRAM circuit. An insulating layer 30 overlies a doped active area 32 of a semiconductor substrate 34. The substrate 34 comprises a single crystal silicon wafer, according to the industry standard, though it will be understood that invention may have application in conjunction with other materials. The insulating layer 30 of the preferred embodiments comprises an oxide in the form of borophosphosilicate glass (BPSG) though, again, alternate materials are equally viable (e.g., oxide-nitride-oxide composite, TEOS, etc.). The insulating layer 30 most preferably has a thickness of about 2 microns (20,000 Å), although thicknesses will vary depending upon the application.

A contact via 35 has been etched through the insulating layer 30, at least partially exposing the active area 32. The etch may be performed by any known technique, preferably by a process selective against the silicon of the substrate 34. The etch should also be anisotropic to produce a via 35 having a vertical sidewall 38. The multiple vias of the DRAM and the corresponding active areas may thus be packed as densely as permitted by photolithographic resolution and other processing limitations. Most preferably, the etch comprises a magnetically enhanced reactive ion etch (MERIE) reactor, flowing equal amounts of $CF_4$ and $CHF_3$. The chamber pressure should be maintained at about 200 mTorr, the applied magnetic field at about 50 Gauss, and the applied RF energy at about 600 W. The wafer should be etched under these conditions for enough time to clear the insulating layer 30 through the mask down to the substrate 34. In fact, an overetch (about 25%) should be performed to ensure that the substrate 34 is cleaned of all insulating layer 30 at the contact 35.

In accordance with future DRAM design requirements, the contact via 35 should have a diameter 40 of less than about 10,000 Å (1 micron), and more preferably less than about 5,000 Å, and most preferably about 3,000 Å. The contact via 35 may be characterized by an aspect ratio of between about 2 and 10. Given the thickness of the preferred embodiments' insulating layer 30 (i.e., 2 microns, or 20,000 Å), the aspect ratio of the preferred via 35 is about 20,000/3,000, or about 7. It will be understood that drawings are merely schematic and not drawn to scale.

Figure 3:
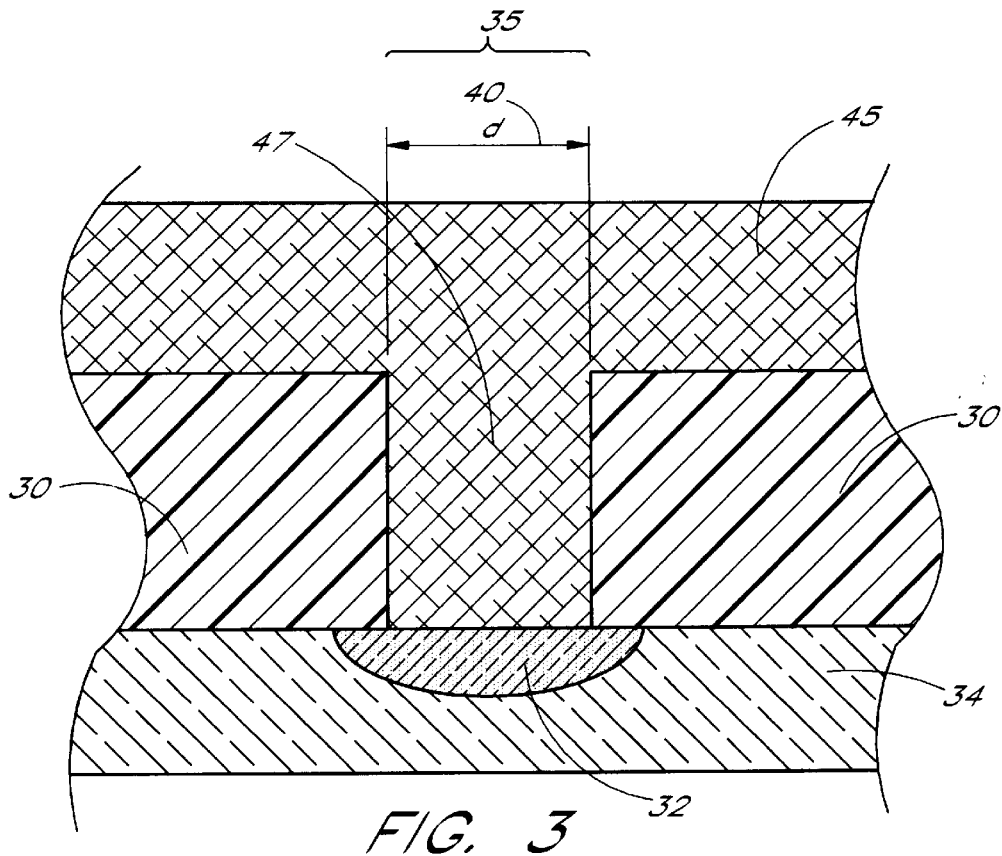
Figure 4:
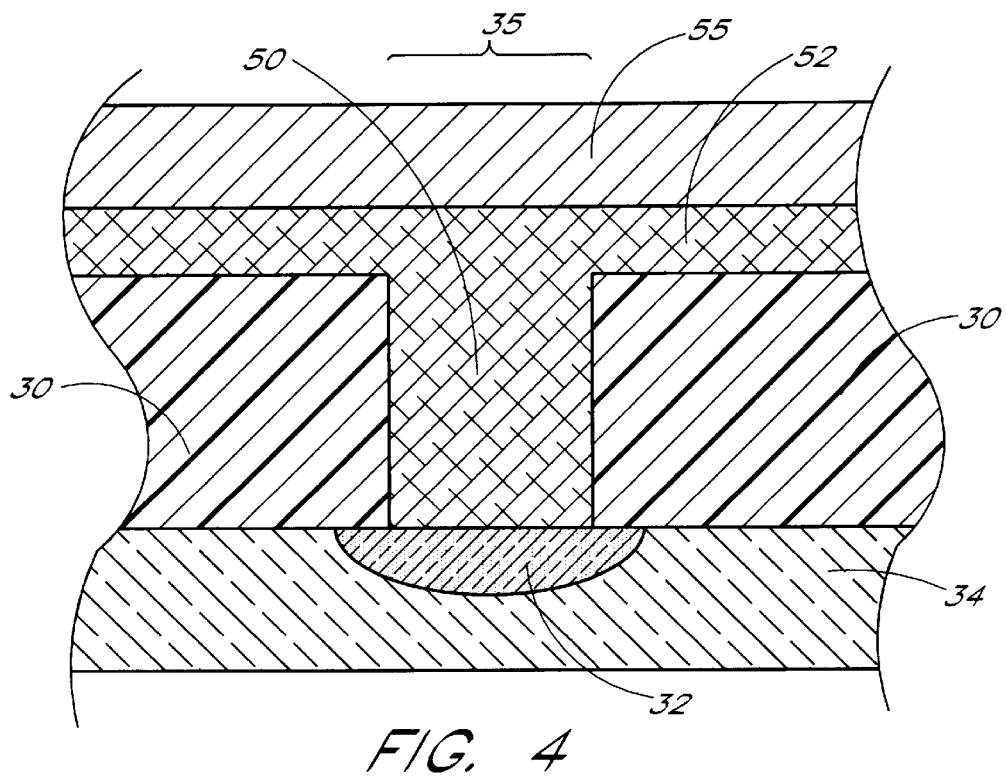
FIG. 4 is a schematic, sectional view of a titanium silicide contact plug and interconnect with a metal strap, constructed in accordance with a second preferred embodiment of the present invention.
Figure 5:
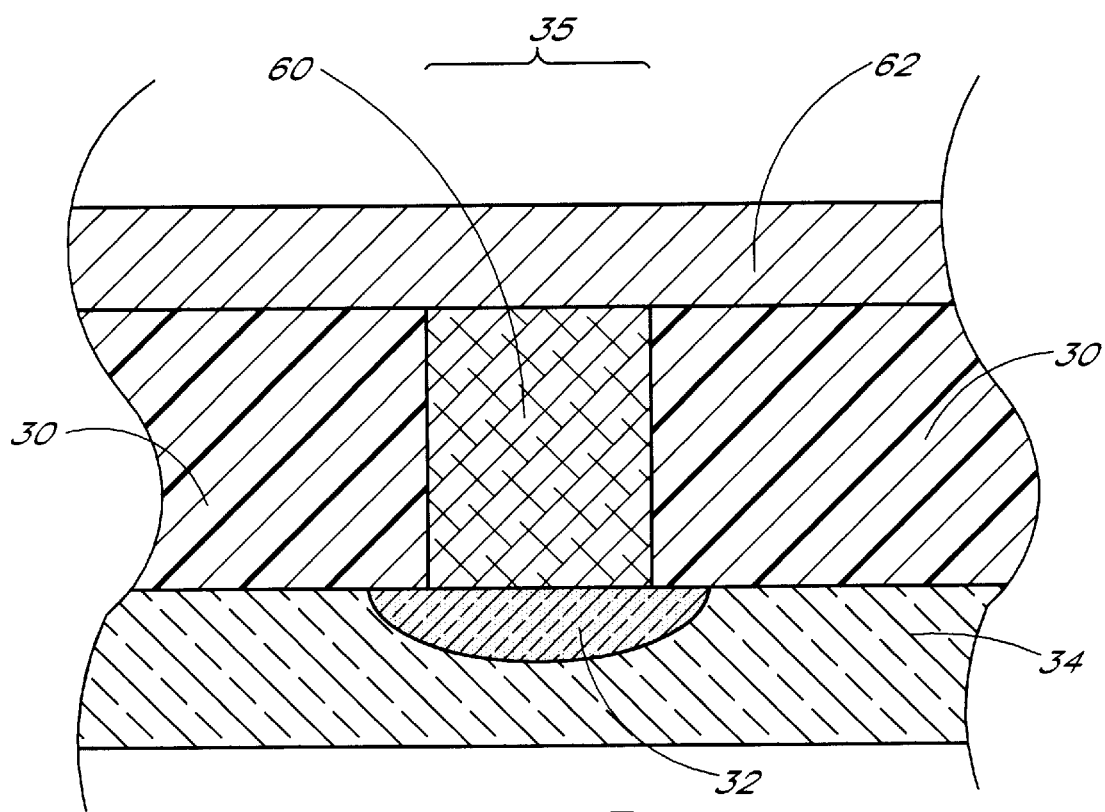
FIG. 5 is a schematic, sectional view of a titanium suicide contact plug and a metal interconnect, constructed in accordance with a third preferred embodiment of the present invention.

Ordinarily, such narrow, high aspect ratio vias are difficult to fill with good step coverage. The present invention, however, proposes to fill the via 35 with metal silicide, as illustrated in FIGS. 3–5. Additionally, in some embodiments, the interconnect line may be at least partially formed simultaneously from the same material, as illustrated in FIGS. 3 and 4, for example. Thus, metallization may be performed in relatively few process steps. Indeed, for the first preferred embodiment, both the contact fill and the interconnect layer may be formed in a single process step, radically reducing fabrication costs as compared to prior art tungsten plugs.

Metal silicide is known to provide low contact resistance, while at the same time providing relatively low sheet resistance over short distances. Such materials may be employed as local interconnect materials over short distances in static random access memory chips (SRAMs), for example, though longer range metal interconnects are still required for the SRAM word or bit lines carrying high density currents. Most often, however, silicide has been used as an intermediate layer between active areas and conductive metal lines.

Figure 1:
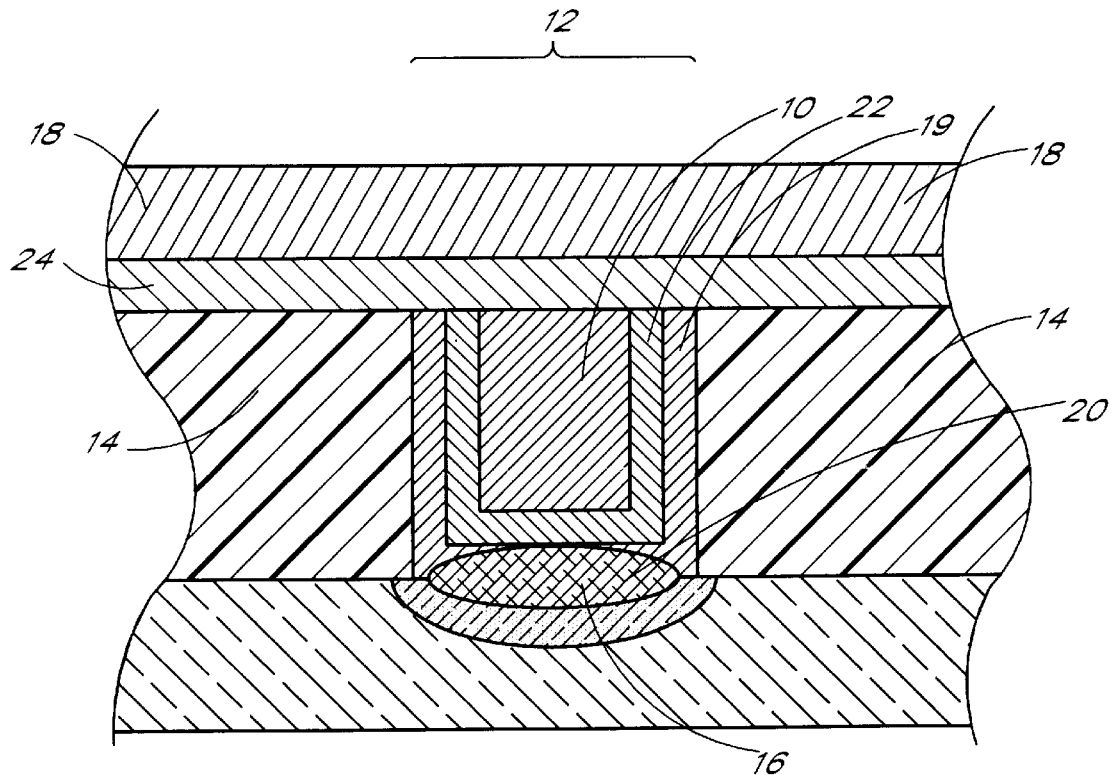
FIG. 1 is a schematic, sectional view of a prior art tungsten plug in an integrated circuit, providing electrical contact between a circuit node and a metal interconnect layer.

One common method of forming metal silicide is a self-aligned silicidation process, often referred to as "salicidation." A thin layer of refractory metal, such as tungsten or titanium, is deposited over the dielectric layer and through the contact opening to contact the underlying silicon active area. The structure is generally heated in a first sinter step at high temperature in a nitrogen environment to form titanium silicide 20 (predominantly $TiSi_2$), for example, as shown in the prior art tungsten plug fabrication of FIG. 1. During the sinter, titanium reacts with the exposed silicon (at the contact) to form $TiSi_2$.

Salicidation, however, is accompanied by numerous difficulties. During the sinter process, both silicon and dopant from shallow junctions diffuse into the forming silicide. Dopant depletion from shallow junctions causes junction leakage and/or high contact resistance. At the same time interstitials or spikes are injected into the substrate, increasing diffusion of the dopants into the silicide and exacerbating the leakage problem. Often, high anneal temperatures are required later in the integration process to activate dopants. This may cause agglomeration and therefore high resistance within the silicide line. Additionally, salicidation (used to clad polysilicon gates and MOS source/drains with silicide) is prone to causing shorts across oxide spacers, reducing yield. More importantly, the refractory metal is generally deposited by sputter processes, which have poor step coverage into high aspect ratio vias.

For this reason, the present invention incorporates a chemical vapor deposition (CVD) method for completely filling the contact via 35 with titanium silicide, with little risk of forming keyholes. Recently, CVD methods have been developed to directly deposit silicides, rather than to require high temperature reactions of metal layers with silicon source layers. Various CVD methods for titanium silicide, for example, have been described in U.S. Pat. Nos. 5,240,739, No. 5,278,100, No. 5,376,405, all issued to Doan et al., and No. 5,344,792, issued to Sandhu et al. The disclosure of each of the foregoing patents are hereby incorporated by reference. These references generally describe low pressure CVD (LPCVD) methods for depositing suicides, and particularly titanium silicide, which may be incorporated into the present invention. For example, a process incorporating silane ($SiH_4$) as the silicon source may be performed with titanium tetrachloride ($TiCl_4$) as the titanium source.

Although any conformal titanium silicide CVD method may be incorporated into the present process flow, processes conducted at less than 700° C. are preferred, due to a reduced likelihood of damage to pre-existing structures at such lower temperatures. CVD processes employing metal organic precursors, for example, may be conducted at much lower temperatures than those involving $TiCl_4$. Most preferably, however, a disilane ($Si_2H_6$) is employed as the silicon source, while $TiCl_4$ remains the as the titanium source. Reactants for the preferred embodiments include $TiCl_4$ flowed at a rate between 1 and 30 sccm, most preferably about 5 sccm, and $Si_2H_6$ flowed between 5 and 50 sccm, most preferably about 10 sccm. The carrier gas should be a noble gas, most preferably argon (Ar) flowed between 100 and 1000 sccm, most preferably about 400 sccm. Reactor pressure should be maintained between about 0.5 and 30 Torr, 20 Torr being most preferred, while the temperature may be maintained 400° C. and 600° C., most preferably about 530° C. The lower temperatures lead to less risk of reactor damage, and less damage to the wafer as well. It should be understood that the parameters listed above represent only optimal ranges for a conformal, low temperature deposition, and that depositions outside of these parameters may be equally viable.

FIG. 3 illustrates the integrated circuit after a titanium silicide deposition according to the first preferred embodiment over the insulating layer 30 and into the contact via 35. A resulting silicide layer 45 is of the form $TiSi_x$, predominantly $TiSi_2$. The suicide 45 should be deposited to a thickness of at least about 50% of the via diameter 40, and most preferably greater than 50%, ensuring a complete fill of the via 35 to form a contact plug 47. Since the diameter 40 of the preferred via 35 herein described is about 3,000 Å, the titanium silicide should be deposited to a thickness of at least about 1,500 Å. Careful control of deposition parameters will ensure that the via 35 is completely full, though occasional formation of small keyholes may be tolerable.

For the first preferred embodiment, illustrated in FIG. 3, the silicide layer 45 constitutes the interconnect line. In this case, the silicide layer 45 ought to have a thickness of at least about 3,000 Å and most preferably about 5,000 Å. Thicknesses substantially less than 3,000 Å would result in too high a sheet resistivity for the silicide layer 45 to function as an interconnect. Thicknesses substantially greater than 10,000 Å, on the other hand, are excessive and wasteful of both space and materials. Note that the drawings are merely schematic and not drawn to scale.

A post-deposition anneal may then be performed to lower the resistance level of the silicide layer 45, converting the silicide from a C49 phase to a lower resistivity C54 phase. This optional step, at a temperature of about 850° C., should be conducted prior to any further depositions, depending upon the embodiment.

FIG. 4 illustrates a silicide plug 50 and an interconnect layer 51 in accordance with a second preferred embodiment. For this embodiment, a titanium silicide layer 52, though deposited to a thickness of at least about half the via diameter 40 (FIG. 2), need not be as thick as that of the first preferred embodiment. Rather, the thickness of the silicide layer 52 of this embodiment is most preferably about 2,000 Å, an overdeposit of only about 500 Å to ensure a complete fill of the via 35 (thus forming the plug 50). Alternatively, the silicide 52 may originally be deposited to a greater thickness (e.g., 2,500 to 3,000) Å and then etched back to a thickness of about 2,000, simultaneously thinning and planarizing the silicide layer 52.

A metal strap 55 of thickness between about 500 Å and 3,000 Å then supplements the conductivity of the silicide layer 52, thus forming the low resistance interconnect layer 51. The strap 55 of the second preferred embodiment comprises aluminum or an aluminum alloy, though any material of similarly low resistivity will serve. Most preferably, the strap 55 comprises an aluminum/copper (Al/Cu) alloy, approximately 1,000 Å thick. The metal may be deposited by any known means over the silicide layer 52, including sputter deposition or CVD methods. The silicide layer 52 and Al/Cu strap 55 together form the interconnect 51 of the present embodiment, which is thinner than the silicide layer 45 of the first preferred embodiment (FIG. 3) while demonstrating comparable resistivity. The total height of the interconnect 51 is thus reduced by use of the strap 55, smoothing the circuit topology at this point and facilitating subsequent fabrication processes.

An optional layer of titanium nitride, or a Ti/TiN composite (not shown) may be deposited between deposition of the silicide layer 52 and the strap 55, in a variation of the second preferred embodiment. After a densifying anneal, the TiN would act as a diffusion barrier, preventing downward diffusion of metal atoms which may otherwise react with underlying silicon. In such a case, the TiN or Ti/TiN strap also forms part of the interconnect layer 51.

FIG. 5 illustrates a titanium silicide plug 60 and a metal interconnect layer 62 in accordance with a third preferred embodiment of the present invention. As with the second embodiment, titanium silicide should be deposited to at least a thickness of about 2,000 Å, to ensure a complete fill of the contact via 35. Following the silicide deposition, however, a planarizing etchback may be performed to leave only the titanium silicide plug 60 substantially flush with an exposed top surface of the insulating layer 30. Since there are not multiple layers within the via 35 which could be overetched, unlike prior art tungsten via fills, selectivity is not critical to the etchback.

Most preferably, the etchback comprises an anisotropic blanket etch, such as a chlorine- or fluorine-based plasma etch, well known to the skilled artisan. The metal interconnect 62, most preferably comprising a co-sputtered aluminum alloy such as Al/Cu, may then be deposited to a thickness between about 1,000 Å and 3,000 Å, most preferably about 2,000 Å. Such a thickness should result in an interconnect resistivity comparable to that of the previously described embodiments.

It can be seen that all of the above-described embodiments include a contact via fill and formation of an interconnect layer with many fewer steps than prior art tungsten plug and interconnect fabrication, for example. The interconnect must also be patterned in accordance with particular circuit design. Ordinarily, patterning is accomplished by etching interconnect lines in the previously deposited blanket conductive layer. Conventional photolithographic mask processes, followed by metal (or silicide) etch may be used in conjunction with the preferred embodiments of the present invention, as they have been used in conjunction with prior art interconnects. Where interconnect line spacing is small, however, as required by current design parameters, patterning by metal etch through a mask risks undesired shorts and opens from mask misalignment, residual metal, inadequate photoresist development, etc. As a result, the circuit's interconnect level may demonstrate a high defect density, leading to data errors or complete circuit failure.

The interconnect lines of the present invention, however, may also be defined by a BPSG trench fill and subsequent etchback, rather than masking and etching through the metal or metal silicide. Although the concept of a trench fill is well known in the art of integrated circuit fabrication, forming a tungsten plug in a contact via leading downward from the bottom of a trench is impractical for current and future circuit dimensions. As noted in the "Background" section, tungsten plugs generally require sputter deposited titanium films coating the via walls prior to tungsten deposition. Where the via is within a trench, the trench height exacerbates step coverage problems by effectively increasing the via aspect ratio.

On the other hand, a via within a trench may be filled with excellent step coverage by CVD titanium silicide, in accordance with the present invention. A layer of BPSG 2.5 microns thick, for example, may be etched through a standard photo mask to define trenches in which interconnect lines are to be formed. The trenches should be at least as deep as the desired thickness of the interconnect lines, but more preferably the trenches should be deeper by approximately 500 Å to allow for a planarizing etchback. At the same time, the BPSG remaining below the trench bottoms should be approximately 2 microns deep, or at least enough to provide interlevel isolation.

A second mask may define the contact vias, which are etched through to underlying circuit nodes. The vias are then filled with CVD titanium silicide in accordance with the preferred embodiments discussed above, but in this case overfilling both the vias and the trenches prior to a planarizing etchback step. For example, the first preferred embodiment calls for a silicide layer 45 of about 5,000 Å. For this embodiment, the trenches should be etched to a depth of about 5,000 Å and the titanium silicide deposited to a thickness of about 6,000 Å. The additional 1,000 Å is then removed in a chemical mechanical planarization (CMP) etchback, leaving the interconnect lines defined within the trenches and removing any short-circuiting overlayer. CMP is known in this art. The skilled artisan will understand that similar adjustments may be made to the second and third embodiments described above, or to other embodiments within the scope of the present invention, such as to leave aluminum-strapped interconnect lines or aluminum lines within previously formed trenches.

Utilizing the contact metallization of the preferred embodiments in conjunction with pre-patterned trenches, therefore, allows definition of interconnect lines without etching through the metal interconnect material. While a mask is still required to pattern the trenches, the mask is utilized to etch through an insulating layer, which is typically more reliable than etches through a metal layer. As such, risk of forming shorts from metal residue, for example, is reduced, thus lowering the average defect density of the interconnect lines.

Although the foregoing invention has been described in terms of certain preferred embodiments, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

We claim:

1. A DRAM integrated circuit, comprising a semiconductor substrate, at least one circuit node, an insulating layer overlying the circuit node, at least one contact hole formed through the insulating layer, the hole substantially filled with a titanium silicide plug in electrical contact with the circuit node, and a conductive interconnect layer overlying the insulating layer, the contact plug in electrical contact with the interconnect layer.

2. The DRAM integrated circuit of claim 1, wherein the interconnect layer comprises a titanium silicide layer superjacent the insulating layer and the contact plug.

3. The DRAM integrated circuit of claim 2, wherein the interconnect layer further comprises a metal layer overlying and in electrical connection with the titanium silicide layer.

4. The DRAM integrated circuit of claim 3, further comprising a titanium nitride layer intermediate and providing electrical connection between the metal layer and the titanium silicide layer.

5. The DRAM integrated circuit of claim 1, wherein the interconnect layer comprises a metal layer superjacent the insulating layer and the contact plug.

6. The DRAM integrated circuit of any of claims 3–5, wherein the metal layer comprises an aluminum/copper alloy.

7. The DRAM integrated circuit of claim 1, wherein the contact hole is characterized by an aspect ratio between about 2 and 10.

* * * * *

UNITED STATES PATENT AND TRADEMARK OFFICE
CERTIFICATE OF CORRECTION

PATENT NO.    : 6,137,180
DATED         : October 24, 2000
INVENTOR(S)   : Sandhu et al.

It is certified that error appears in the above-identified patent and that said Letters Patent is hereby corrected as shown below:

Column 1,
Line 53, please replace "capacitances" with -- capacitance --.

Column 10,
Line 28, please replace "hole" with -- holer --.

Signed and Sealed this

Twenty-second Day of April, 2003

JAMES E. ROGAN
*Director of the United States Patent and Trademark Office*